(12) United States Patent
Huo et al.

(10) Patent No.: US 7,029,766 B2
(45) Date of Patent: Apr. 18, 2006

(54) ORGANIC ELEMENT FOR ELECTROLUMINESCENT DEVICES

(75) Inventors: Shouquan Huo, Webster, NY (US); Joseph C. Deaton, Rochester, NY (US); Allan F. Sowinski, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 47 days.

(21) Appl. No.: 10/729,238

(22) Filed: Dec. 5, 2003

(65) Prior Publication Data

US 2005/0123788 A1    Jun. 9, 2005

(51) Int. Cl.
*H05B 33/14* (2006.01)

(52) U.S. Cl. ............... 428/690; 428/917; 313/504; 313/506; 313/112; 257/98

(58) Field of Classification Search ........... 428/690, 428/917; 313/504, 506, 112; 257/98
See application file for complete search history.

(56) References Cited

U.S. PATENT DOCUMENTS

| 5,283,132 | A * | 2/1994 | Ogura et al. ............. 428/690 |
| 2001/0019782 | A1* | 9/2001 | Igarashi et al. .......... 428/690 |
| 2002/0168544 | A1* | 11/2002 | Fukuoka et al. ......... 428/690 |
| 2002/0179885 | A1 | 12/2002 | Che et al. ............. 252/301.16 |

FOREIGN PATENT DOCUMENTS

| WO | 03/040257 | 5/2003 |
| WO | 03/093283 | 11/2003 |
| WO | 2004/039781 | 5/2004 |

OTHER PUBLICATIONS

Chavarot et al., Tetrahedron Letters, 40, (1999) (no month stated), p. 6865-6868.*
Barigelletti et al., Chem. Comm., (1997) (no month stated), pp. 333-338.*
Bonnefous et al., Inorganic Chemistry, Oct. 2001, vol. 40, pp. 5851-5859.*
Belay et al., Inorganic Chemistry, (1994) (no month stated), vol. 33, pp. 2543-2547.*
D. Cárdenas, et al., "Divergent Behavior of Palladium(II) and Platinum(II) in the Metalation of 1,3-Di(2-pyridyl) benzene", Organometallics, 18, pp. 3337-3341, Jul. 1999.
J. A. Gareth Williams, et al., "An Alternative Route to Highly Luminescent Plantinum(II) Complexes: Cyclometalation with NCN—Coordinating Dipyridylbenzene Ligands", Inorganic Chemistry, vol., 42, No. 26,, pp. 8609-8611, Nov. 2003.

* cited by examiner

*Primary Examiner*—Dawn Garrett
(74) *Attorney, Agent, or Firm*—Arthur E. Kluegel

(57) ABSTRACT

Disclosed is an electroluminescent device comprising a light-emitting layer containing a light emitting material that contains an organometallic complex comprising a metal selected from the group consisting of Pt, Pd and Ir, and a tridentate (N^C^N) ligand, wherein the tridentate (N^C^N) ligand represents a ligand that coordinates to the metal through a nitrogen donor bond, a carbon-metal bond, and a nitrogen donor bond, in that order, wherein at least one of the nitrogen donors is part of an aromatic ring or an imine group. The invention also includes a display or room lighting device employing the device of the invention and a process of emitting light from the device of the invention.

The device of the invention provides good luminance efficiency.

28 Claims, 1 Drawing Sheet

US 7,029,766 B2

ORGANIC ELEMENT FOR ELECTROLUMINESCENT DEVICES

FIELD OF THE INVENTION

This invention relates to an organic light emitting diode (OLED) electroluminescent (EL) device comprising a light-emitting layer containing an organometallic complex that provides desirable electroluminescent properties.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often >100V.

More recent organic EL devices include an organic EL element consisting of extremely thin layers (e.g. <1.0 µm ) between the anode and the cathode. Herein, the term "organic EL element" encompasses the layers between the anode and cathode electrodes. Reducing the thickness lowered the resistance of the organic layer and has enabled devices that operate much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [J. Applied Physics, Vol. 65, Pages 3610–3616, 1989]. The light-emitting layer commonly consists of a host material doped with a guest material Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

Many emitting materials that have been described as useful in an OLED device emit light from their excited singlet state by fluorescence. The excited singlet state is created when excitons formed in an OLED device transfer their energy to the excited state of the dopant. However, it is generally believed that only 25% of the excitons created in an EL device are singlet excitons. The remaining excitons are triplet, which cannot readily transfer their energy to the singlet excited state of a dopant. This results in a large loss in efficiency since 75% of the excitons are not used in the light emission process.

Triplet excitons can transfer their energy to a dopant if it has a triplet excited state that is low enough in energy. If the triplet state of the dopant is emissive it can produce light by phosphorescence, wherein phosphorescence is a luminescence involving a change of spin state between the excited state and the ground state. In many cases singlet excitons can also transfer their energy to lowest singlet excited state of the same dopant. The singlet excited state can often relax, by an intersystem crossing process, to the emissive triplet excited state. Thus, it is possible, by the proper choice of host and dopant, to collect energy from both the singlet and triplet excitons created in an OLED device and to produce a very efficient phosphorescent emission.

One class of useful phosphorescent materials are transition metal complexes having a triplet excited state. For example, fac-tris(2-phenylpyridinato-N,C$^{2'}$)iridium(III) (Ir (ppy)$_3$) strongly emits green light from a triplet excited state owing to the large spin-orbit coupling of the heavy atom and to the lowest excited state which is a charge transfer state having a Laporte allowed (orbital symmetry) transition to the ground state (K. A. King, P. J. Spellane, and R. J. Watts, J Am. Chem. Soc., 107, 1431 (1985), M. G. Colombo, T. C. Brunold, T. Reidener, H. U. Gudel, M. Fortsch, and H.-B. Burgi, Inorg. Chem., 33, 545 (1994) Small-molecule, vacuum-deposited OLEDs having high efficiency have also been demonstrated with Ir(ppy)$_3$ as the phosphorescent material and 4,4'-N,N'-dicarbazole-biphenyl (CBP) as the host (M. A. Baldo, S. Lamansky, P. E. Burrows, M. E. Thompson, S. R. Forrest, Appl. Phys. Lett., 75, 4 (1999), T. Tsutsui, M.-J. Yang, M. Yahiro, K. Nakamura, T. Watanabe, T. Tsuji, Y. Fukuda, T. Wakimoto, S. Miyaguchi, Jpn. J. Appl. Phys., 38, L1502 (1999)).

Another class of phosphorescent materials include compounds having interactions between atoms having d$^{10}$ electron configuration, such as Au$_2$(dppm)Cl$_2$ (dppm=bis(diphenylphosphino)methane) (Y. Ma et al, Appl. Phys. Lett., 74, 1361 (1998)). Still other examples of useful phosphorescent materials include coordination complexes of the trivalent lanthanides such as Th$^{3+}$ and Eu$^{3+}$ (J. Kido et al, Appl. Phys. Lett., 65, 2124 (1994)). While these latter phosphorescent compounds do not necessarily have triplets as the lowest excited states, their optical transitions do involve a change in spin state of 1 and thereby can harvest the triplet excitons in OLED devices.

Although many phosphorescent Ir complexes have been described as useful in an EL device, Pt-based organometallic complexes have not been examined as extensively. Some Pt phosphorescent complexes include cyclometallated Pt(I) complexes such as cis-bis(2-phenylpyridinato-N,C$^{2'}$)platinum(II), cis-bis(2-(2'-thienyl)pyridinato-N,C$^{3'}$) platinum (II), cis-bis(2-(2'-thienyl)quinolinato-N,C$^{5'}$) platinum(II), or (2-(4,6-diflourophenyl)pyridinato-NC2') platinum (II) acetylacetonate. Pt(II) porphyrin complexes such as 2,3,7, 8,12,13,17,18-octaethyl-21H, 23H-porphine platinum(II) are reported in U.S. Pat. No. 6,048,630 as useful phosphorescent materials in an electroluminescent device although they did not give a very high luminance yield. Recently, C. Che, W. Lu, and M. Chan reported organometallic light-emitting materials based on (C^N^N) tridentate cyclometalated Pt(II) arylacetylides. (US 2002/0179885 and references cited therein).

Complexes of a tridentate (N^C^N) ligand have been examined, wherein the tridentate (N^C^N) ligand represents a ligand that coordinates to the metal through a nitrogen donor bond, a carbon-metal bond, and a nitrogen donor bond, in that order, wherein at least one of the nitrogen donors is part of an aromatic ring or an imine group (for example, see D. Cardenas, A. Echavarren, A. M. Ramirez de Arellano, Organometallics (1999), 18, 3337 (1999) and references cited therein). Nevertheless, there continues a need for additional phosphorescent emitters that exhibit good luminance efficiency in electroluminescent devices.

SUMMARY OF THE INVENTION

The invention provides an electroluminescent device comprising a light-emitting layer containing a light emitting material that contains an organometallic complex comprising a metal selected from the group consisting of Pt, Pd and Ir, and a tridentate (N^C^N) ligand, wherein the tridentate (N^C^N) ligand represents a ligand that coordinates to the metal through a nitrogen donor bond, a carbon-metal bond, and a nitrogen donor bond, in that order, wherein at least one of the nitrogen donors is part of an aromatic ring or an imine group. The invention also includes a display or room lighting device employing the device of the invention.

The device of the invention provides good luminance efficiency.

DETAILED DESCRIPTION OF THE INVENTION

Figure 1:
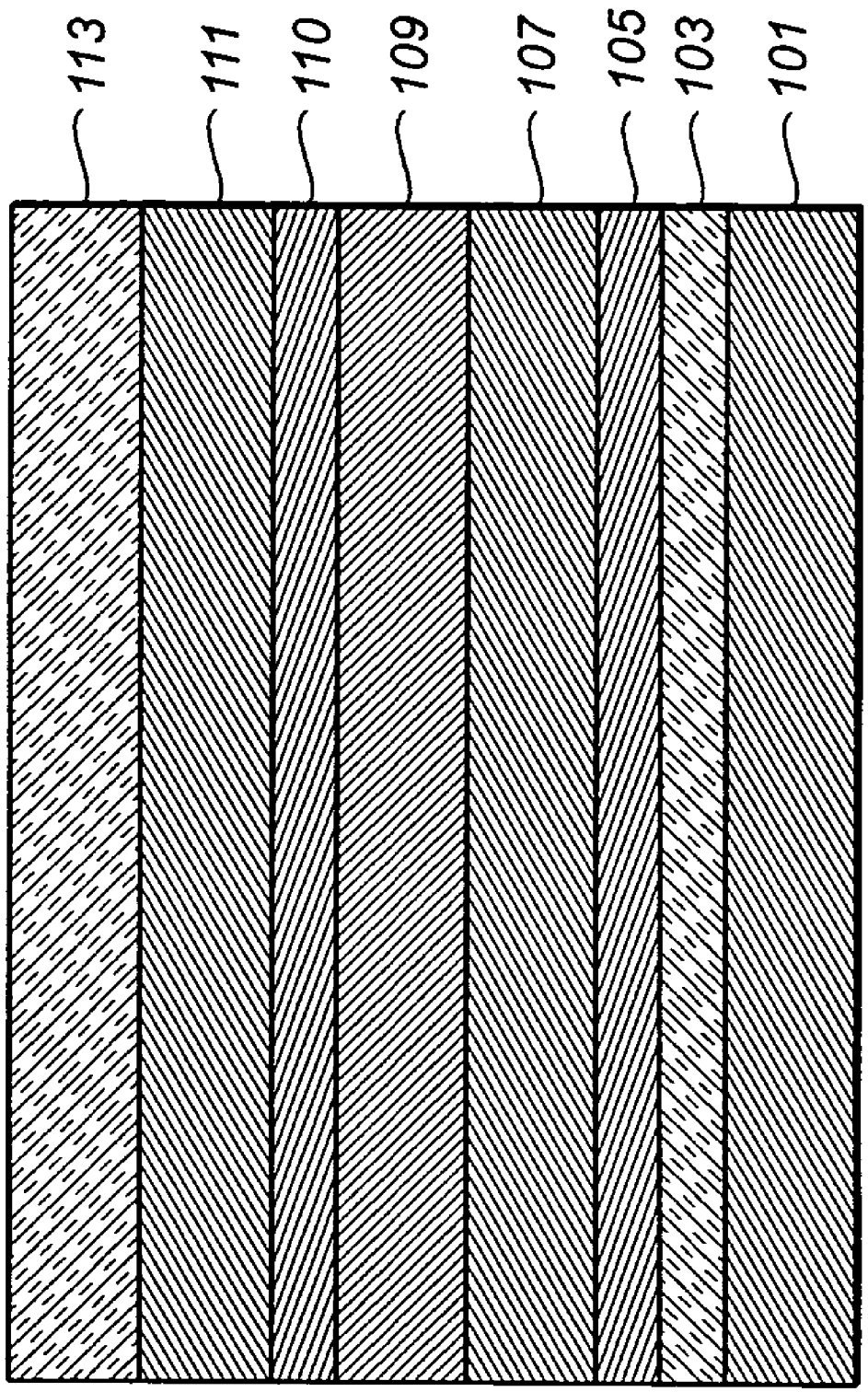
FIG. 1 shows a cross-section of a typical OLED device in which this invention may be used.

The invention is generally summarized above. The organometallic complex of the invention comprises a metal consisting of Pt, Pd or Ir; more desirably the metal is Pt. The metal forms a complex with a tridentate (N^C^N) ligand, wherein the tridentate (N^C^N) ligand represents a ligand that coordinates to the metal through a nitrogen donor bond, a carbon bond, and a nitrogen donor bond, in that order, wherein at least one of the nitrogen donors is part of an aromatic ring or an imine group. The complex may be present in a compound containing two or more complexes. Examples of suitable ligands are shown below. Desirably, both of the nitrogen donors are part of an aromatic ring.

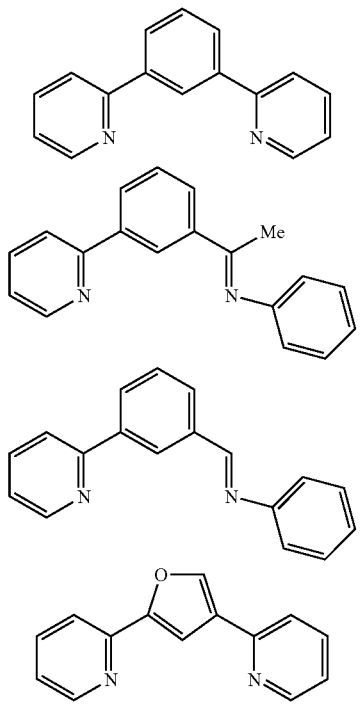

-continued

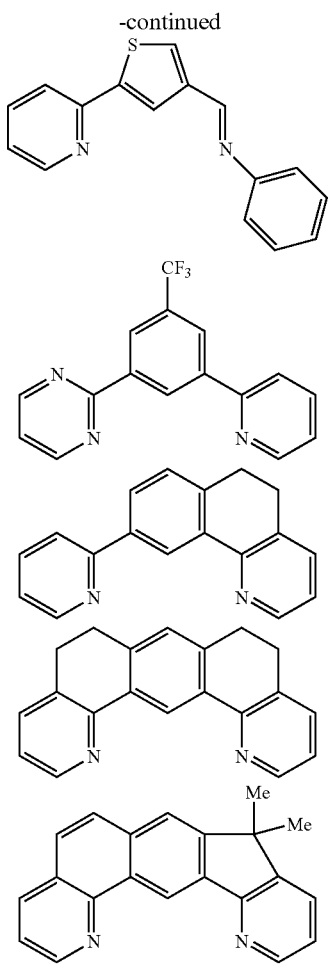

In one suitable embodiment, the tridentate organometallic complex can be incorporated into a polymer light emitting diode (PLED) device. For example, the organometallic complex can be part of the main chain of a polymer, the side chain, or intermixed with a polymer in such a device.

In one desirable embodiment the organometallic complex can be represented by Formula (1a),

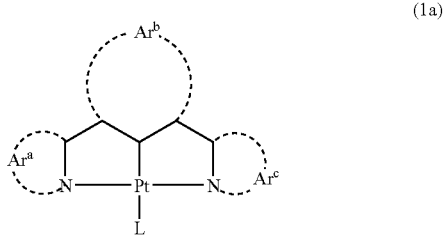

(1a)

wherein:

$Ar^a$, $Ar^b$, and $Ar^c$ independently represent the atoms necessary to form a five or six-membered aromatic ring, which may be further substituted including substitution by fused rings. The term 'aromatic rings' includes aromatic rings that have heteroatoms present in the ring, see for example, J. March, *Advanced Organic Chemistry*, Chapter 2 (1985, publisher John Wiley & Sons, New York, N.Y.). For example, $Ar^b$ can represent the atoms necessary to form groups such as benzene ring groups, thiophene ring groups, or furan ring groups. Likewise, $Ar^a$ and $Ar^c$ can represent the atoms necessary to form groups such as pyridine ring groups, quinoline ring groups, isoquinoline ring groups, and indole ring groups as examples. In one desirable embodiment, $Ar^b$ represents a benzene ring group and $Ar^a$ and $Ar^c$ independently represent pyridine ring groups.

L represents an anionic ligand having a negative charge and formed by loss of hydrogen from the parent compound LH. In the L-metal bond, more of the electron density is localized on L, the ligand. For example, L can represent halogen, that is fluoride, chloride, bromide, or iodide. L can also be chosen so that it forms a carbon-metal bond in the organometallic complex, for example, L can represent a cyanide, an alkynyl group, an alkenyl group, an aryl group, or an alkyl group. Illustrative examples of such L groups are shown below.

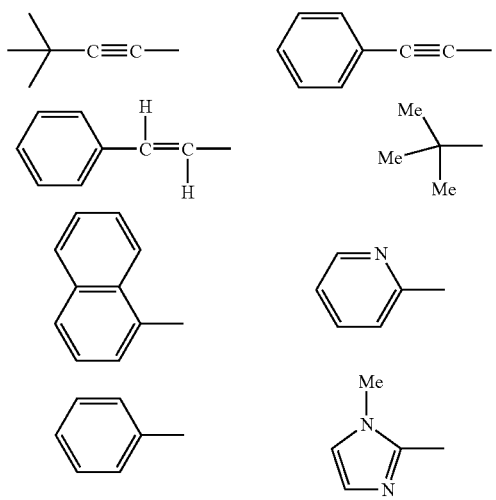

L can also represent RX, wherein X forms a bond to the metal (Pt, Pd or Ir) and wherein X represents N, O, S, or Se, and R represents a substituent. For example, R can represent an aryl group or an alkyl group or a carbonyl group or sulfonyl group. Suitable examples of groups represented by RX are a thiocyanate, alkoxide or aryloxide groups, alkyl sulfide or aryl sulfide groups, a carboxlate group or sulfonate group, for example, acetate, trifluoroacetate, tosylate, triflate. Illustrative examples of RX are also given below.

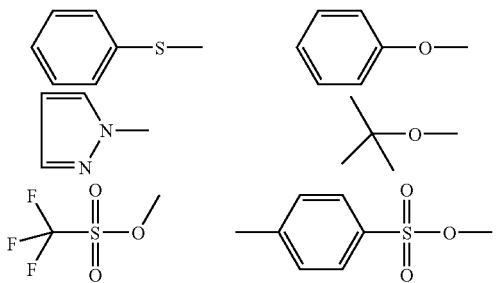

In one desirable embodiment the organometallic complex of the invention can be represented by Formula (1b).

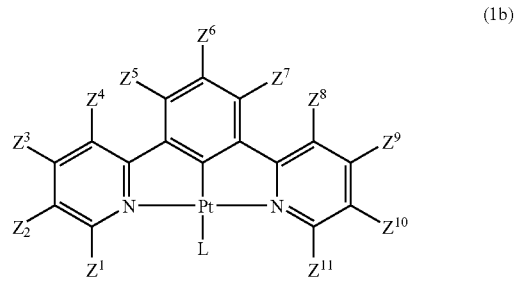

$Z^1$–$Z^{11}$ of formula (1b) represent hydrogen or independently selected substituent groups, provided that adjacent substituent groups can combine to form rings. Examples of substituents are phenyl groups, alkyl groups such as methyl groups or t-butyl groups. $Z^4$ and $Z^5$ as well as $Z^7$ and $Z^8$ can also combine to form rings, for example, a 6-membered saturated ring or a 6-membered aromatic ring. L represents ian anionic ligand.

In another desirable embodiment the organometallic complex can be represented by Formula (1c).

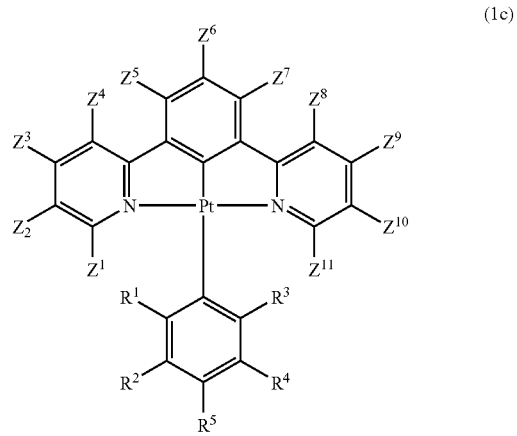

As described above, $Z^1$–$Z^{11}$ represent hydrogen or independently selected substituent groups, provided that adjacent substituent groups can combine to form rings, and provided that $Z^4$ and $Z^5$ as well as $Z^7$ and $Z^8$ can combine to form rings. L represents is an anionic ligand.

$R^1$–$R^5$ represent hydrogen or independently selected substituents, provided that adjacent substituents may combine to form a ring group, which may be further substituted including substitution by fused rings. For example, $R^1$ and $R^3$ can independently represent groups such as methyl groups or isopropyl groups. $R^1$ and $R^2$, and $R^3$ and $R^4$ can combine to form rings such as benzene ring groups or tolyl ring groups.

Synthetic Method

Synthesis of the emitting materials useful in the invention may be accomplished by preparing the organic ligand and then using a metal to complex the ligand and form the organometallic compound. Suitable tridentate ligands and their metal complexes can be prepared by various literature methods, for example, see M. Beley, J. Collin, J. Sauvage, *Inorg. Chem.*, 32, 4539(1993), M. Beley, J. Collin, R. Louis, B. Metz, J. Sauvage, *J. Am. Chem. Soc.*, 113, 8521 (1991), D. Cardenas, A. Echavarren, Antonio M.; Ramirez de Arellano, M. Carmen, *Organometallics*, 18, 3337 (1999), and M. Sindkhedkar, H. Mulla, M. Wurth, A. Cammers-Goodwin, *Tetrahedron*, 57, 2991(2001). For example, one synthetic method involves reaction of a bromo compound (Rxn-1, wherein $Ar^w$ represents the atoms necessary to complete a five or six-membered aromatic ring group) with butyllithium at low temperature, followed by addition of zinc chloride. This affords a zinc intermediate. This intermediate need not be isolated; after addition of tetrakis(triphenylphosphine)palladium, it can be reacted further with 0.5 equivalents of a dibromo compound to afford a tridentate ligand (Rxn-2, wherein $Ar^y$ represents the atoms necessary to complete a five or six-membered aromatic ring group). Alternatively, two equivalents of a bromoheterocyclic compound can be reacted with a diboron intermediate to afford a tridentate ligand (Rxn-3). Unsymmetrical ligands can be made by reacting one equivalent of a bromoheterocyclic compound with a diboron intermediate to afford a bidentate ligand and this ligand can be isolated and then reacted further with another bromoheterocyclic compound to obtain the tridentate ligand (Rxn-4 and Rxn-5, wherein $Ar^z$ represents the atoms necessary to complete a five or six-membered aromatic ring group). The ligands can be isolated and purified by various methods, including column chromatography.

Reaction of the tridentate ligand with a metal salt, for example potassium tetrachloroplatinate, affords the desired organometallic complex (Rxn-6). The chloro group in the organometallic complex can be replaced by other ligands. For example, chloride can be replaced by reaction of the complex with an aryl lithium or zinc salt or a copper catalyzed reaction with an acetylene substituted group (Rxn-7 and Rxn-8, wherein $Ar^s$ represents a five or six-membered aromatic ring group, $R^w$ is a substituent group).

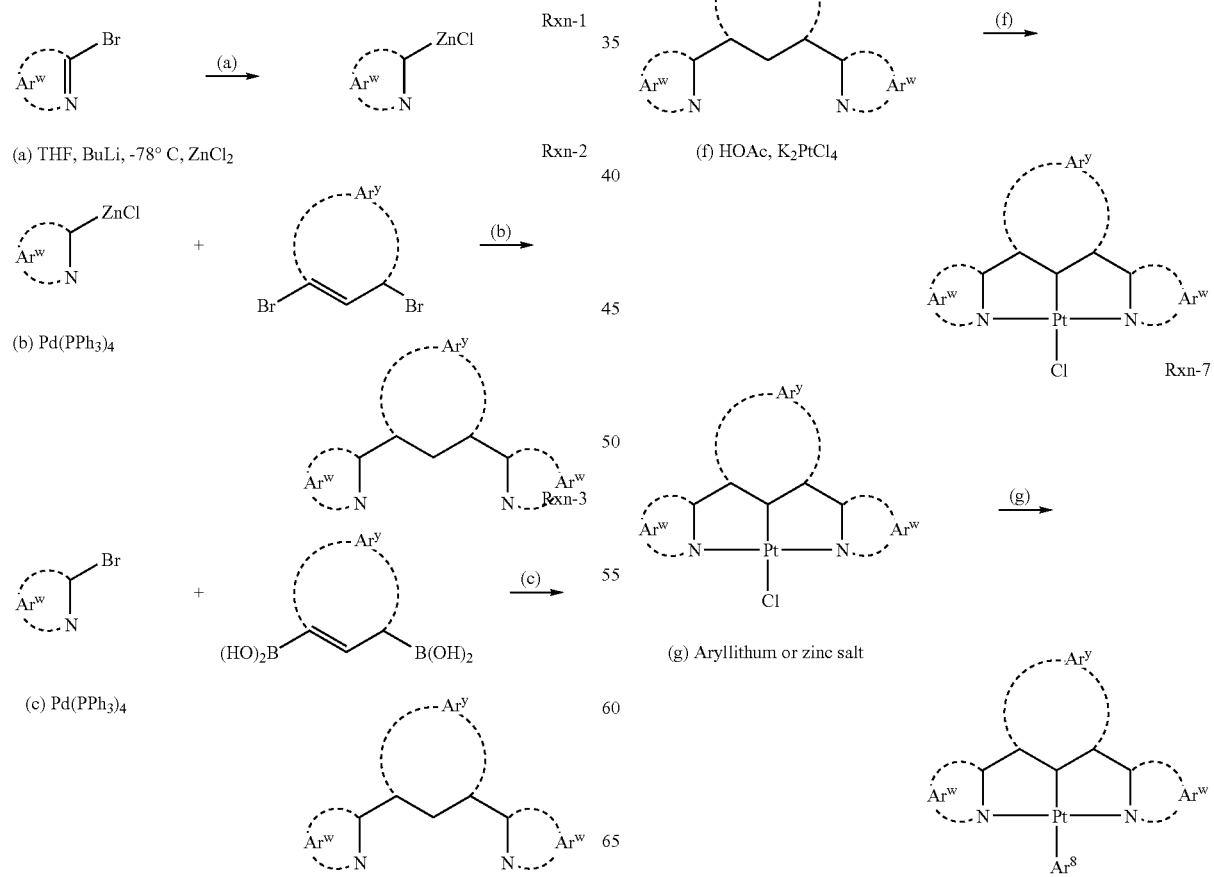

-continued
Rxn-8
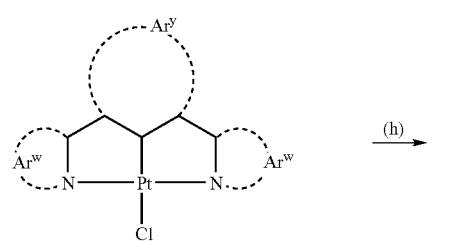
(h) CuI/Et₃N
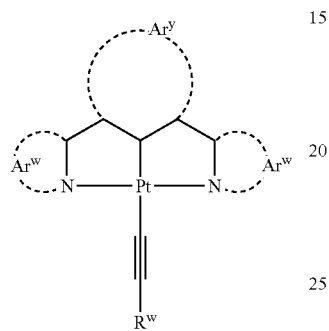
Illustrative examples of complexes of Formula (1) useful in the present invention are the following:
Inv-1
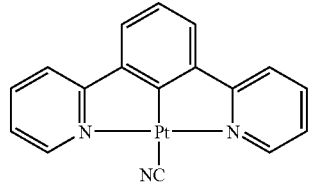
Inv-2
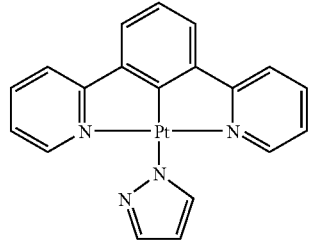
Inv-3
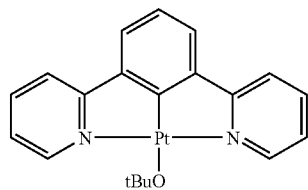
Inv-4
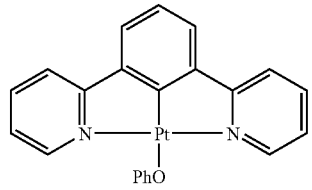
Inv-5
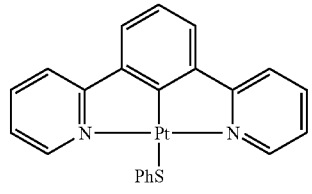
Inv-6
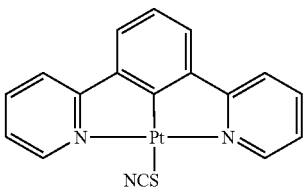
Inv-7
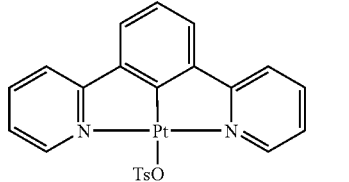
Inv-8
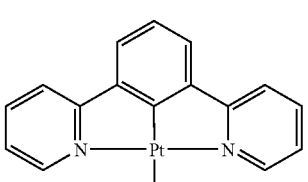
Inv-9
Inv-10
Inv-11
Inv-12

-continued
Inv-13
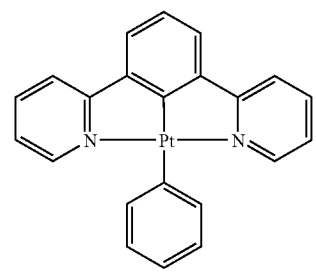
Inv-14
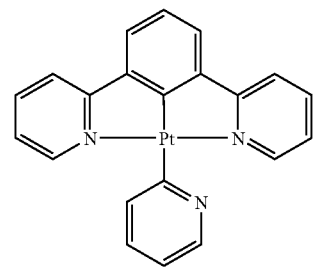
Inv-15
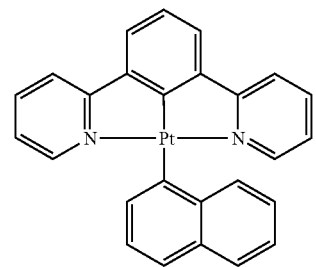
Inv-16
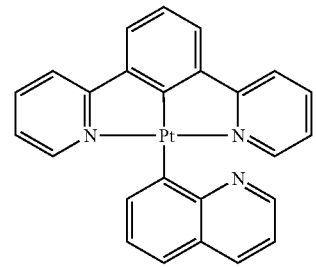
Inv-17
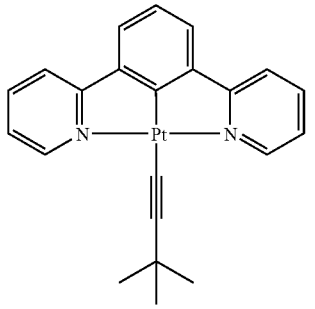
-continued
Inv-18
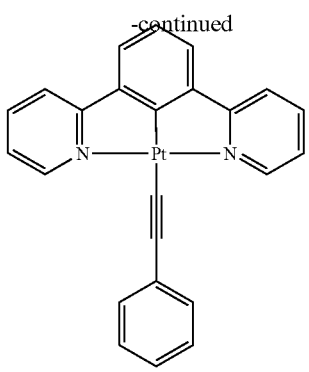
Inv-19
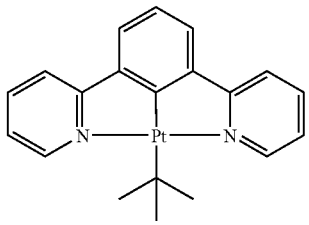
Inv-20
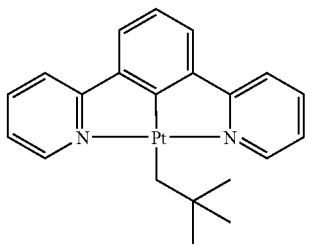
Inv-21
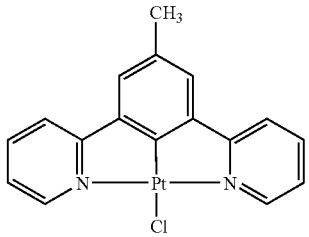
Inv-22
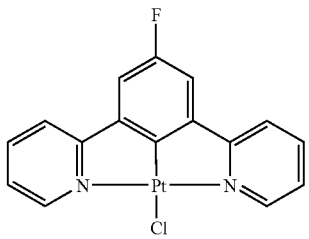

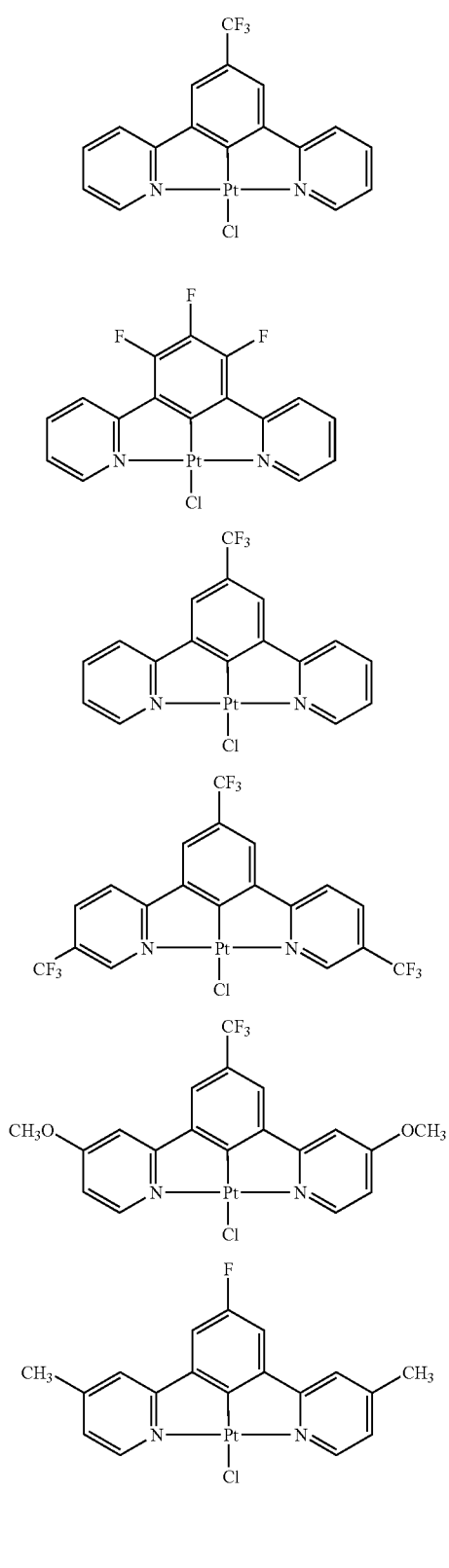

-continued
Inv-36
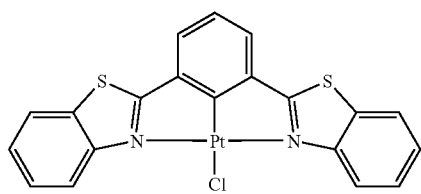
Inv-37
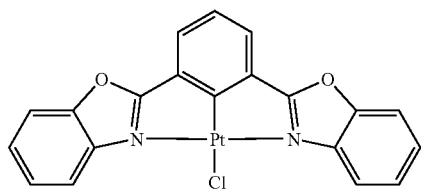
Inv-38
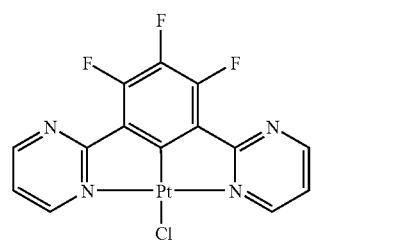
Inv-39
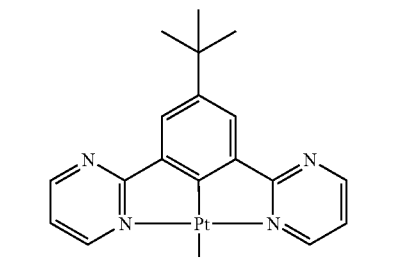
Inv-40
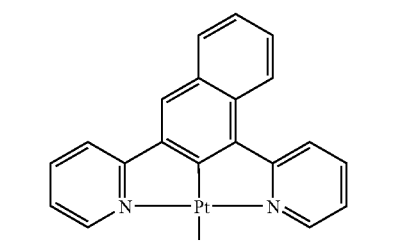
Inv-41
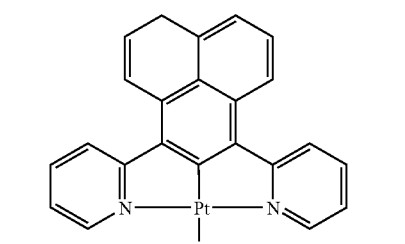
Inv-42
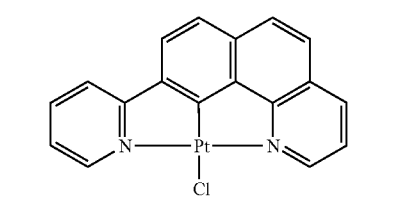
-continued
Inv-43
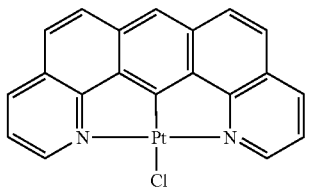
Inv-44
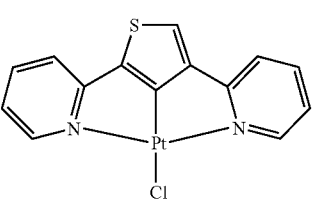
Inv-45
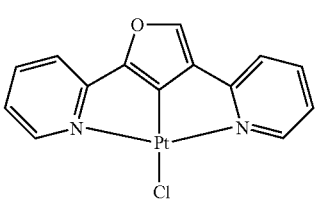
Inv-46
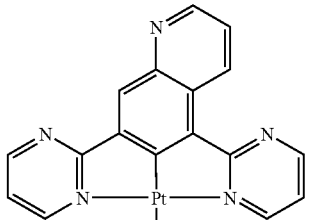
Inv-47
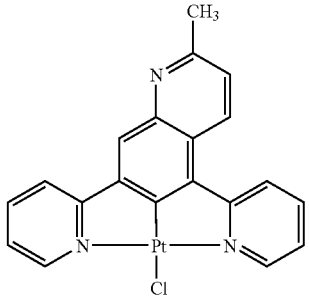
Inv-48
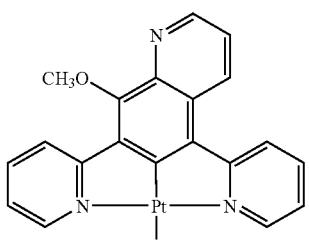

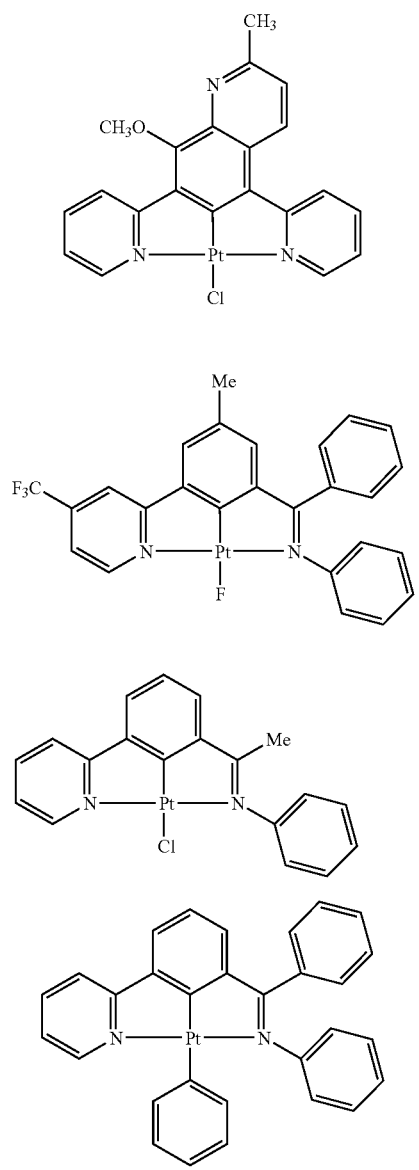

-continued
Inv-55
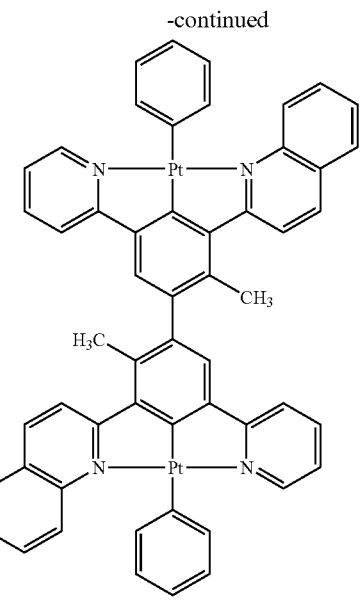
Inv-56
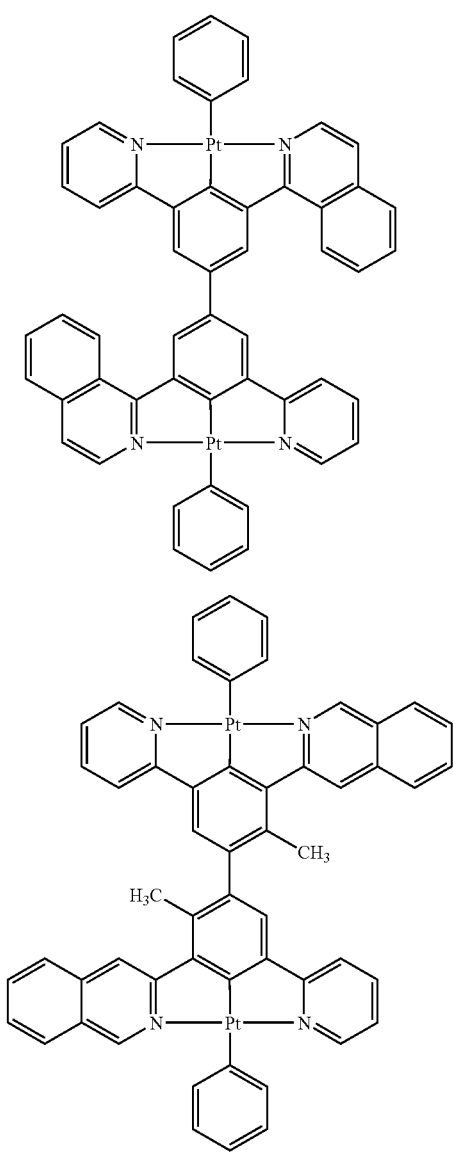
Inv-57
Inv-58
Unless otherwise specifically stated, use of the term "substituted" or "substituent" means any group or atom other than hydrogen. Unless otherwise provided, when a group (including a compound or complex) containing a substitutable hydrogen is referred to, it is also intended to encompass not only the unsubstituted form, but also form further substituted derivatives with any substituent group or groups as herein mentioned, so long as the substituent does not destroy properties necessary for utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxopyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecyl-sulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

Suitably, the light-emitting layer of the OLED device comprises a host material and one or more guest materials for emitting light. At least one of the guest materials is suitably a phosphorescent complex comprising a ring system of Formula 1a. The light-emitting guest material(s) is usually present in an amount less than the amount of host materials and is typically present in an amount of up to 15 wt % of the host, more typically from 0.1–10.0 wt % of the host For convenience, the phosphorescent complex guest material may be referred to herein as a phosphorescent material. The phosphorescent material of Formula 1a is preferably a low molecular weight compound, but it may also be an oligomer or a polymer having a main chain or a side chain of repeating units having the moiety represented by Formula 1a. It may be provided as a discrete material dispersed in the host material, or it may be bonded in some way to the host material, for example, covalently bonded into a polymeric host.

Host Materials for Phosphorescent Materials

Suitable host materials should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2; 01/39234 A2; 01/93642 A1; 02/074015 A2; 02/15645 A1, and US 20020117662. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-N,N'-dicarbazole-biphenyl, m-(N,N'-dicarbazole)benzene, and poly(N-vinylcarbazole), including their derivatives.

Desirable host materials are capable of forming a continuous film. The light-emitting layer may contain more than one host material in order to improve the device's film morphology, electrical properties, light emission efficiency, and lifetime. The light emitting layer may contain a first host material that has good hole-transporting properties, and a second host material that has good electron-transporting properties.

Other Phosphorescent Materials

Phosphorescent materials of Formula 1a may be used in combination with other phosphorescent materials, either in the same or different layers. Some other phosphorescent materials are described in WO 00/57676, WO 00/70655, WO 01/41512 A1, WO 02/15645 A1, US 2003/0017361 A1, WO 01/93642 A1, WO 01/39234 A2, U.S. Pat. No. 6,458,475 B1, WO 02/071813 A1, U.S. Pat. No. 6,573,651 B2, US 2002/0197511 A1, WO 02/074015 A2, U.S. Pat. No. 6,451,455 B1, US 2003/0072964 A1, US 2003/0068528 A1, U.S. Pat. No. 6,413,656 B1, U.S. Pat. No. 6,515,298 B2, U.S. Pat. No. 6,451,415 B1, U.S. Pat. No. 6,097,147, US 2003/0124381 A1, US 2003/0059646 A1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003073387A, JP 2003 073388A, US 2003/0141809 A1, US 2003/0040627 A1, JP 2003059667A, JP 2003073665A, and US 2002/0121638 A1.

The emission wavelengths of cyclometallated Ir(III) complexes of the type $IrL_3$ and $IrL_2L'$, such as the green-emitting fac-tris(2-phenylpyridinato-N,$C^{2'}$)Iridium(IR) and bis(2-phenylpyridinato-N,$C^{2'}$)Iridium(III)(acetylacetonate) may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand L'. Examples of red emitters are the bis(2-(2'-benzothienyl)pyridinato-N,$C^{3'}$)Iridium(III)(acetylacetonate) and tris(1-phenylisoquinolinato-N,C)Iridium(H). A blue-emitting example is bis(2-(4,6-diflourophenyl)-pyridinato-N,$C^{2'}$)Iridium(II)(picolinate).

Red electrophosphorescence has been reported, using bis(2-(2'-benzo[4,5-a]thienyl)pyridinato-N,$C^{3'}$) iridium (acetylacetonate) [$Btp_2Ir(acac)$] as the phosphorescent material (Adachi, C., Lamansky, S., Baldo, M. A., Kwong, R. C., Thompson, M. E., and Forrest, S. R., *App. Phys. Lett.*, 78, 1622–1624 (2001).

Still other examples of useful phosphorescent materials include coordination complexes of the trivalent lanthanides such as $Tb^{3+}$ and $Eu^{3+}$ (J. Kido et al, *Appl. Phys. Lett.*, 65, 2124 (1994))

Blocking Layers

In addition to suitable hosts, an OLED device employing a phosphorescent material often requires at least one exciton or hole blocking layers to help confine the excitons or electron-hole recombination centers to the light-emitting layer comprising the host and phosphorescent material. In one embodiment, such a blocking layer would be placed between the electron-transporting layer and the light-emitting layer—see FIG. 1, layer 110. In this case, the ionization potential of the blocking layer should be such that there is an energy barrier for hole migration from the host into the electron-transporting layer, while the electron affinity should be such that electrons pass more readily from the electron-transporting layer into the light-emitting layer comprising host and phosphorescent material. It is further desired, but not absolutely required, that the triplet energy of the blocking material be greater than that of the phosphorescent material. Suitable hole-blocking materials are described in WO 00/70655A2 and WO 01/93642 A1. Two examples of useful materials are bathocuproine (BCP) and bis(2-methyl-8-quinolinolato)(4-phenylphenolato)Aluminum(Ill) (BAlQ). Metal complexes other than Balq are also known to block holes and excitons as described in US 20030068528. US 20030175553 A1 describes the use of fac-tris(1-phenylpyrazolato-N,C2)iridium(III) (Irppz) in an electron/exciton blocking layer.

Embodiments of the invention can provide advantageous features such as operating efficiency, higher luminance, color hue, low drive voltage, and improved operating stability. Embodiments of the organometallic compounds useful in the invention can provide a wide range of hues including those useful in the emission of white light (directly or through filters to provide multicolor displays).

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure, especially useful for of a small molecule device, is shown in FIG. 1 and is comprised of a substrate 101, an anode 103, a hole-injecting layer 105, a hole-transporting layer 107, a light-emitting layer 109, a hole- or exciton-blocking layer 110, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source through electrical conductors. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials such as glass or polymers. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Again, the substrate can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, the transmissive characteristics of the anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Cathode

When light emission is viewed solely through the anode, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EL) in contact with an organic layer (e.g., an electron transporting layer (ETL)) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-Injecting Layer (HIL)

A hole-injecting layer 105 may be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable-triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A).

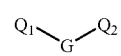

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

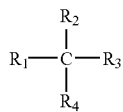
B where
$R_1$ and $R_2$ each independently represents a hydrogen atom, an aryl group, or an alkyl group or $R_1$ and $R_2$ together represent the atoms completing a cycloalkyl group; and
$R_3$ and $R_4$ each independently represents an aryl group, which is in turn substituted with a diaryl substituted amino group, as indicated by structural formula (C):

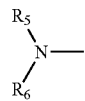
C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

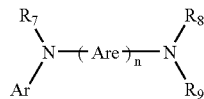
D wherein
each Are is an independently selected arylene group, such as a phenylene or anthracene moiety,
n is an integer of from 1 to 4, and
Ar, $R_7$, $R_8$, and $R_9$ are independently selected aryl groups.
In a typical embodiment, at least one of Ar, $R_7$, $R_8$, and $R_9$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:
1,1-Bis(4-di-p-tolylaminophenyl)cyclohexane
1,1-Bis(4-di-p-tolylaminophenyl)-4-phenylcyclohexane
N,N,N',N'-tetraphenyl-4,4'''-diamino-1,1':4',1'':4'',1'''-quaterphenyl
Bis(4-dimethylamino-2-methylphenyl)phenylmethane
1,4-bis[2-[4-[N,N-di(p-toly)amino]phenyl]vinyl]benzene (BDTAPVB)
N,N,N',N'-Tetra-p-tolyl-4,4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4''-diamino-p-terphenyl
4,4'-Bis{N-phenyl-N-[4-(1-naphthyl)-phenyl]amino}biphenyl
2,6-Bis[N,N-di(2-naphthyl)amino]fluorene
4,4',4''-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Fluorescent Light-Emitting Materials and Layers (LEL)

In addition to the phosphorescent materials of this invention, other light emitting materials may be used in the OLED device, including fluorescent materials. Although the term "fluorescent" is commonly used to describe any light emitting material, in this case we are referring to a material that emits light from a singlet excited state. Fluorescent materials may be used in the same layer as the phosphorescent material, in adjacent layers, in adjacent pixels, or any combination. Care must be taken not to select materials that will adversely affect the performance of the phosphorescent materials of this invention. One skilled in the art will understand that triplet excited state energies of materials in the same layer as the phosphorescent material or in an adjacent layer must be appropriately set so as to prevent unwanted quenching.

As more fully described in U.S. Pat. Nos. 4,769,292 and 5,935,721, the light-emitting layer (LEL) of the organic EL element includes a luminescent fluorescent or phosphorescent material where electroluminescence is produced as a result of electron-hole pair recombination in this region. The light-emitting layer can be comprised of a single material, but more commonly consists of a host material doped with a guest emitting material or materials where light emission comes primarily from the emitting materials and can be of any color. The host materials in the light-emitting layer can be an electron-transporting material, as defined below, a hole-transporting material, as defined above, or another material or combination of materials that support hole-electron recombination. Fluorescent emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small molecule emitting materials can be molecularly dispersed into a polymeric host, or the emitting materials can be added by copolymerizing a minor constituent into a host polymer. Host materials may be mixed together in order to improve film formation, electrical properties, light emission efficiency, lifetime, or manufacturability. The host may comprise a material that has good hole-transporting properties and a material that has good electron-transporting properties.

An important relationship for choosing a fluorescent dye as a guest emitting material is a comparison of the singlet excited state energies of the host and light-emitting material. For efficient energy transfer from the host to the emitting material, a highly desirable condition is that the singlet excited state energy of the emitting material is lower than that of the host material.

Host and emitting materials known to be of use include, but are not limited to, those disclosed in U.S. Pat. No. 4,768,292, U.S. Pat. No. 5,141,671, U.S. Pat. No. 5,150,006, U.S. Pat. No. 5,151,629, U.S. Pat. No. 5,405,709, U.S. Pat. No. 5,484,922, U.S. Pat. No. 5,593,788, U.S. Pat. No. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

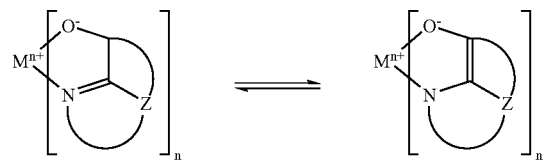

E wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc(II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium(III)]
CO-9: Zirconium oxine [alias, tetra(8-quinolinolato)zirconium(IV)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

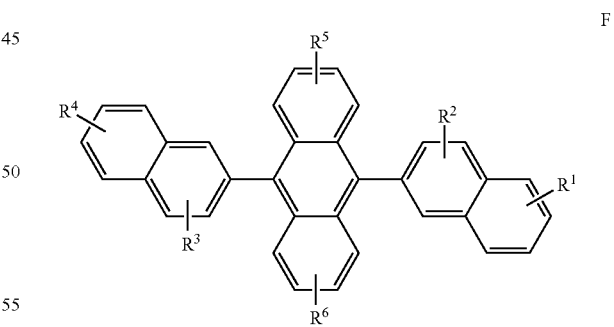

F wherein: $R^1$, $R^2$, $R^3$, $R^4$, $R^5$, and $R^6$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (Formula G) constitute another class of useful host materials capable of supporting electroluminescence, and are particularly suitable for light emission of wavelengths longer than 400 nm, e.g., blue, green, yellow, orange or red.

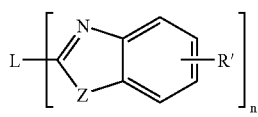

G

Where:
n is an integer of 3 to 8;
Z is O, NR or S; and
R and $R^1$ are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, turyl, thienyl, pyridyl, quinolinyl and other heterocyclic systems; or halo such as chloro, fluoro; or atoms necessary to complete a fused aromatic ring; and
L is a linkage unit consisting of alkyl, aryl, substituted alkyl, or substituted aryl, which conjugately or unconjugately connects the multiple benzazoles together. An example of a useful benzazole is 2,2',2"-(1,3,5-phenylene)tris[1-phenyl-1H-benzimidazole].

Styrylarylene derivatives as described in U.S. Pat. No. 5,121,029 and JP 08333569 are also useful hosts for blue emission. For example, 9,10-bis[4-(2,2-diphenylethenyl)phenyl]anthracene and 4,4'-Bis(2,2-diphenylethenyl)-1, 1'-biphenyl (DPVBi) are useful hosts for blue emission.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds. Illustrative examples of useful materials include, but are not limited to, the following:

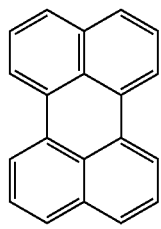

L1

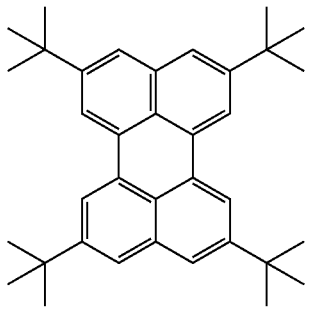

L2

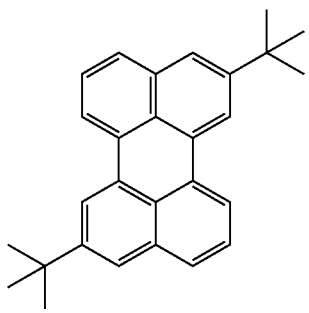

L3

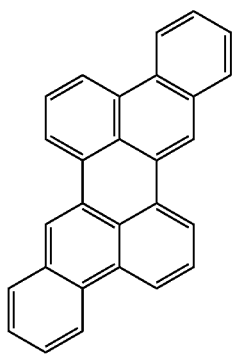

L4

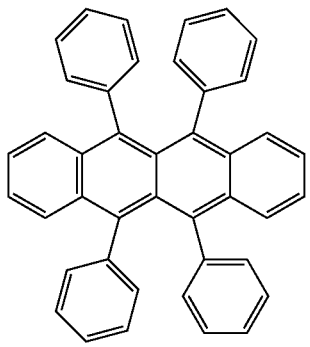

L5

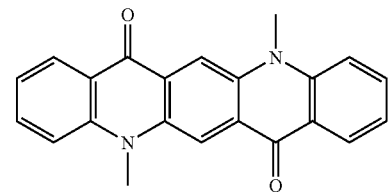

L6

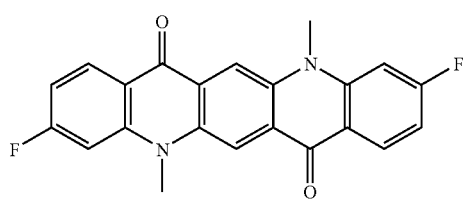

L7

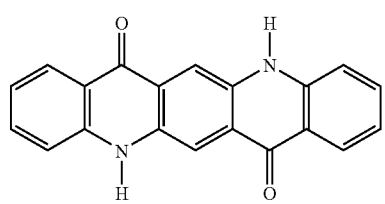

L8

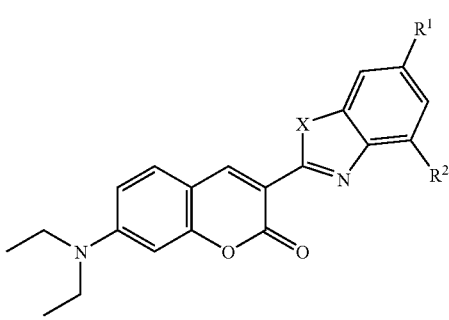

|     | X | R1     | R2     |
| --- | - | ------ | ------ |
| L9  | O | H      | H      |
| L10 | O | H      | Methyl |
| L11 | O | Methyl | H      |
| L12 | O | Methyl | Methyl |
| L13 | O | H      | t-butyl|
| L14 | O | t-butyl| H      |
| L15 | O | t-butyl| t-butyl|
| L16 | S | H      | H      |
| L17 | S | H      | Methyl |
| L18 | S | Methyl | H      |
| L19 | S | Methyl | Methyl |
| L20 | S | H      | t-butyl|
| L21 | S | t-butyl| H      |
| L22 | S | t-butyl| t-butyl|

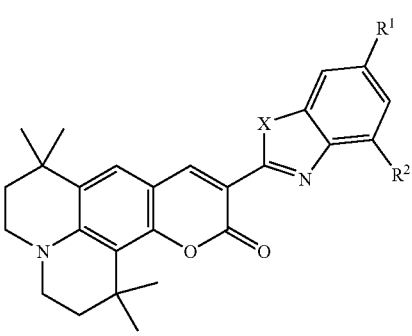

|     | X | R1     | R2     |
| --- | - | ------ | ------ |
| L23 | O | H      | H      |
| L24 | O | H      | Methyl |
| L25 | O | Methyl | H      |
| L26 | O | Methyl | Methyl |
| L27 | O | H      | t-butyl|
| L28 | O | t-butyl| H      |
| L29 | O | t-butyl| t-butyl|
| L30 | S | H      | H      |
| L31 | S | H      | Methyl |
| L32 | S | Methyl | H      |
| L33 | S | Methyl | Methyl |
| L34 | S | H      | t-butyl|
| L35 | S | t-butyl| H      |
| L36 | S | t-butyl| t-butyl|

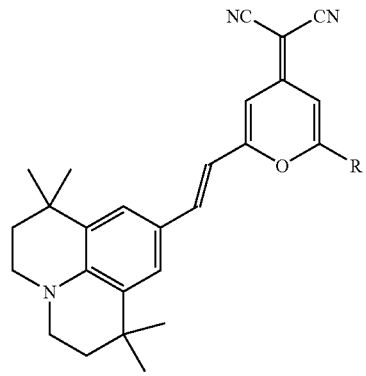

|     | R       |
| --- | ------- |
| L37 | phenyl  |
| L38 | methyl  |
| L39 | t-butyl |
| L40 | mesityl |

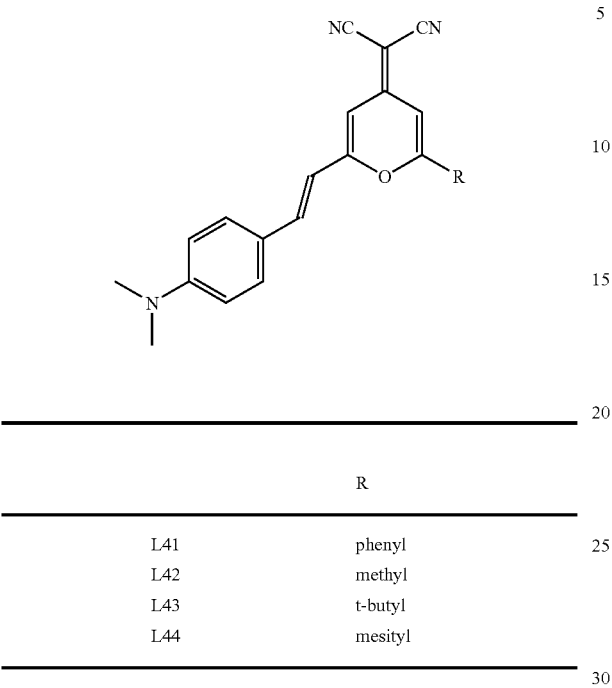
| | R |
|---|---|
| L41 | phenyl |
| L42 | methyl |
| L43 | t-butyl |
| L44 | mesityl |
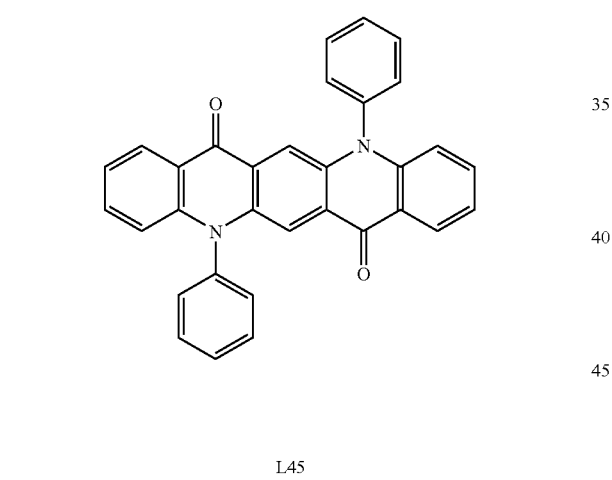
L45
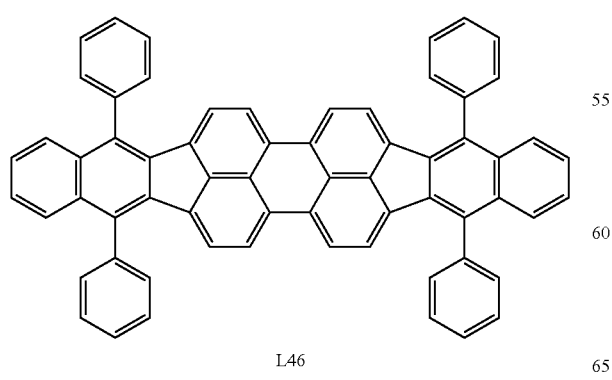
L46
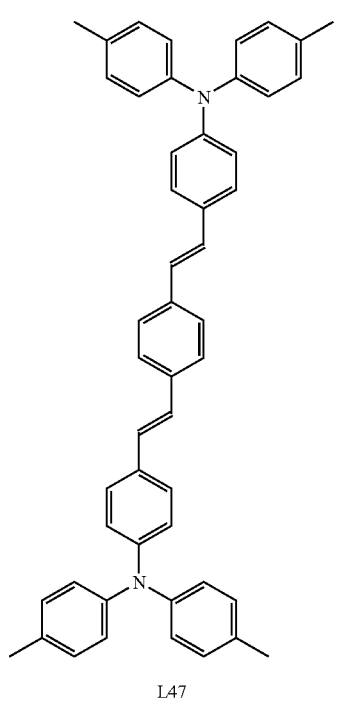
L47
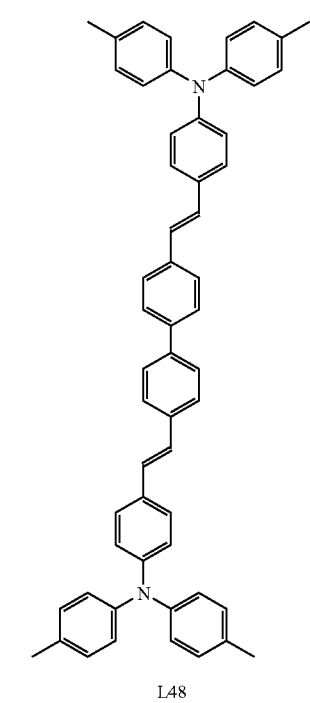
L48

-continued

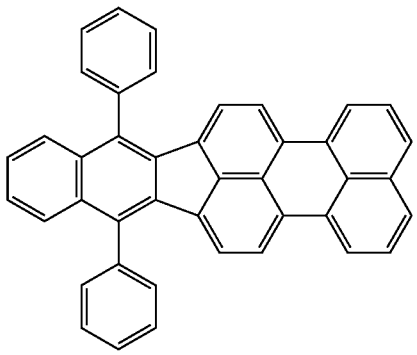

L49

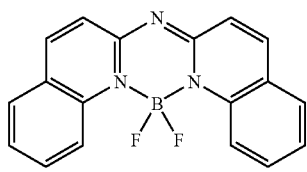

L50

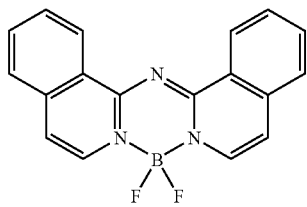

L51

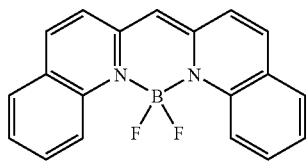

L52

Electron-Transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials.

Other Useful Organic Layers and Device Architecture

In some instances, layers 109 through 111 can optionally be collapsed into a single layer that serves the function of supporting both light emission and electron transportation. Layers 110 and 111 may also be collapsed into a single layer that functions to block holes or excitons, and supports electron transportation. It also known in the art that emitting materials may be included in the hole-transporting layer, which may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182 and can be equipped with a suitable filter arrangement to produce a color emission.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited by any means suitable for the form of the organic materials. In the case of small molecules, they are conveniently deposited through sublimation, but can be deposited by other means such as from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,688,551, U.S. Pat. No. 5,851,709 and U.S. Pat. No. 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the cover or as part of the cover.

The invention and its advantages can be better appreciated by the following examples.

SYNTHETIC EXAMPLE 1

This example illustrates the preparation of the platinum complexes of the invention. The tridentate ligand 1,3-di(2-pyridyl)benzene was prepared by the following procedure. A solution of 2-bromopyridine (12.38 g, 78.4 mmol) in anhydrous THF (100 mL) was cooled with a dry ice-acetone bath and was added dropwise to a solution of n-BuLi in hexanes (53.6 mL, 1.6 M, 85.8 mmol) under nitrogen atmosphere. After addition was complete (ca. 30 min), the resultant mixture was stirred at −78° C. for 30 min. A solution of $ZnCl_2$ in $Et_2O$ (50 mL, 1.0 M, 50 mmol, Aldrich) was added slowly into the reaction mixture via syringe (ca. 10 min). The dry ice-acetone bath was removed after the addition of $ZnCl_2$ and the mixture was warmed to room temperature. $Pd(PPh_3)_4$ (1.84 g, 1.6 mmol, Aldrich) was added to the reaction mixture and followed by 1,3-dibromobenzene (6.14 g, 26 mmol). The mixture was stirred at room temperature for 3 h then refluxed for 22 h. After cooling to room temperature, the mixture was quenched with MeOH (10 mL). The crude product was purified by repeated chromatography on silica gel with $CH_2Cl_2$-EtOAc (from 6:1 to 4:1). This afforded 4.78 g of 1,3-di(2-pyridyl)benzene, 79% yield; $^1$H NMR Spectrum (300 MHz, $CDCl_3$, TMS): δ 7.1–7.2 (m, 2 H), 7.55 (t, J=7.6 Hz, 1 H), 7.65–7.7 (m, 2 H), 7.75–8.1 (m, 2 H), 8.65–8.7 (m, 3 H); $^{13}$C NMR spectrum(75 MHz, CDCl3, TMS): δ 120.42 (2C), 122.01 (2C), 125.25, 127.19 (2C), 128.96, 136.51 (2C), 139.59 (2C), 149.37 (2C), 156.84 (2C).

The complex Inv-1 was prepared according to the literature procedure by the reaction of potassium tetrachloroplatinate with 1,3-di(2-pyridyl)benzene in acetic acid at 110–115° C. for 3 days (D. Cardenas, A. Echavarren, M. Ramirez de Arellano, *Organometallic,* 18, 3337 (1999)) and purified by flash chromatography on silica gel with $CH_2Cl_2$-EtOAc (9:1) eluent. A sublimed sample was used for OLED device preparation.

The emission spectra of Inv-1 was obtained at room temperature in ethyl acetate solution using a procedure well known to those skilled in the art (see, for example, C. A. Parker and W. T. Rees, *Analyst,* 85, 587 (1960)). Compound Inv-1 had a λmax of emission of 488 nm with a quantum yield of 0.271.

DEVICE EXAMPLE 1

An EL device (Sample 1) satisfying the requirements of the invention was constructed in the following manner:
1. A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$.
3. A hole-transporting layer (HTL) of N,N'-di-1-naphthyl-N,N'-diphenyl-4,4'-diaminobiphenyl (NPB) having a thickness of 75 nm was then evaporated from a tantalum boat.
4. A 35 nm light-emitting layer (LEL) of 4,4'-N,N'-dicarbazole-biphenyl (CBP) and Inv-1 (2% wt %) were then deposited onto the hole-transporting layer. These materials were also evaporated from tantalum boats.
5. A hole-blocking layer of bathocuproine (BCP) having a thickness of 10 nm was then evaporated from a tantalum boat.
6. A 40 nm electron-transporting layer (ETL) of tris(8-quinolinolato)aluminum (III) ($AlQ_3$) was then deposited onto the light-emitting layer. This material was also evaporated from a tantalum boat.
7. On top of the $AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

Samples 2 and 3 were fabricated in an identical manner to Sample 1 except emitter Inv-1 was used at levels indicated in the table. Sample 4 was fabricated in an identical manner to Sample 1 except compound Inv-1 was not included. The cells thus formed were tested for luminance and color at an operating current of 20 $mA/cm^2$ and the results are reported in Table 1 in the form of luminance, emission wavelength and CIE (Commission Internationale de L'Eclairage) coordinates

TABLE 1

Evaluation Results for EL devices.

| Sample | Inv-1 (%) | Luminance ($cd/m^2$) | Emission λmax | CIEx | CIEy | Type |
|---|---|---|---|---|---|---|
| 1 | 2 | 3201 | 496 | 0.233 | 0.602 | Invention |
| 2 | 4 | 3511 | 496 | 0.238 | 0.606 | Invention |
| 3 | 6 | 3016 | 496 | 0.246 | 0.603 | Invention |
| 4 | 0 | 113 | 456 | 0.184 | 0.210 | Comparison |

As can be seen from Table 1, all tested EL devices incorporating the invention emitting material demonstrated a superior green color and higher luminance relative to the comparative device without the material.

DEVICE EXAMPLE 2—COMPARATIVE

An EL device, Sample 5, was constructed and evaluated in the same manner as Sample 1 described above, except Com-1 was used in place of Inv-1. Samples 6 and 7 were prepared and evaluated in the same manner as Sample 5, except emitter Com-1 was used at the level indicated in Table 2.

TABLE 2

Com-1

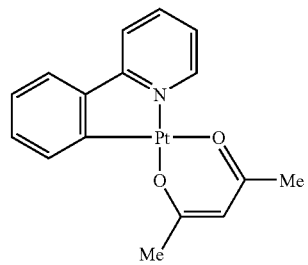

Evaluation Results for EL devices.

| Sample | Com-1 Level (%) | Luminance ($cd/m^2$) | Efficiency (W/A) | CIEx | CIEy | Type |
|---|---|---|---|---|---|---|
| 5 | 2 | 424 | 0.019 | 0.249 | 0.457 | Comparison |
| 6 | 4 | 595 | 0.025 | 0.296 | 0.489 | Comparison |
| 7 | 6 | 711 | 0.030 | 0.330 | 0.498 | Comparison |

As can be seen from. Table 2, all tested EL devices incorporating the comparative phosphorescent organometallic material demonstrated poor efficiency.

The invention has been described in detail with particular reference to certain preferred embodiments thereof, but it will be understood that variations and modifications can be affected within the scope of the invention. The entire contents of the patents and other publications referred to in this specification are incorporated herein by reference.

Parts List

101 Substrate
103 Anode
105 Hole-Injecting Layer (HIL)
107 Hole-Transporting Layer (HTL)
109 Light-Emitting Layer (LEL)
110 Hole-Blocking Layer (HBL)
111 Electron-Transporting Layer (ETL)
113 Cathode

What is claimed is:

1. An electroluminescent device comprising a light-emitting layer containing a light emitting material that contains an organometallic complex comprising a metal selected from the group consisting of Pt, Pd and Ir, and a tridentate (N^C^N) ligand, wherein the tridentate (N^C^N) ligand represents a ligand that coordinates to the metal through a nitrogen donor bond, a carbon-metal bond, and a nitrogen donor bond, in that order, wherein at least one of the nitrogen donors is part of an aromatic ring or an imine group.

2. The device of claim 1 wherein the metal is Pt.

3. The device of claim 1 wherein each of the nitrogen donors is part of an aromatic ring.

4. The device of claim 1 wherein the organometallic complex can be represented by Formula (1a),

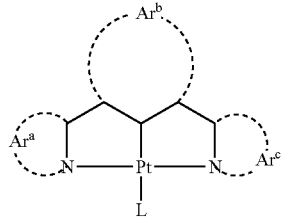

(1a)

wherein:
Ar$^a$, Ar$^b$, and Ar$^c$ independently represent the atoms necessary to form a five or six-membered aromatic ring group; and
L is an anionic ligand.

5. The device of claim 4 wherein Ar$^a$, Ar$^b$, and Ar$^c$ independently represent the atoms necessary to form a six-membered aromatic ring group.

6. The device of claim 4 wherein Ar$^a$ and Ar$^c$ independently represent the atoms necessary to form a pyridine ring group.

7. The device of claim 4 wherein Ar$^b$ represents the atoms necessary to form a benzene ring group.

8. The device of claim 4 wherein L represents halogen.

9. The device of claim 4 wherein L represents a substituent that forms a carbon-platinum bond.

10. The device of claim 4 wherein L represents an alkynyl group, an alkenyl group, an aryl group, or an alkyl group.

11. The device of claim 4 wherein L represents RX, wherein X represents a substituent that forms a bond to platinum and wherein X represents N, O, S, or Se, and R represents a substituent.

12. The device of claim 1 wherein the organometallic complex is represented by Formula (1b),

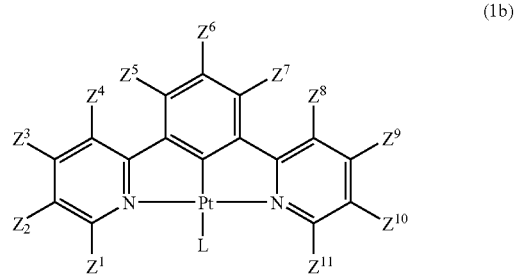

(1b)

wherein,
Z$^1$–X$^{11}$ represent hydrogen or independently selected substituent groups, provided that adjacent substituent groups can combine to form rings, and provided that Z$^4$ and Z$^5$, and Z$^7$ and Z$^8$ can also combine to form rings; and
L represents an anionic ligand.

13. The device of claim 12 wherein L represents halogen, an alkynyl group, an alkenyl group, an aryl group, an alkyl group, or RX, wherein X represents a substituent that forms a bond to platinum and wherein X represents N, O, S, or Se, and R represents an aryl group, an alkyl group, a carbonyl group or a sulfonyl group.

14. The device of claim 1 wherein the organometallic complex can be represented by Formula (1c),

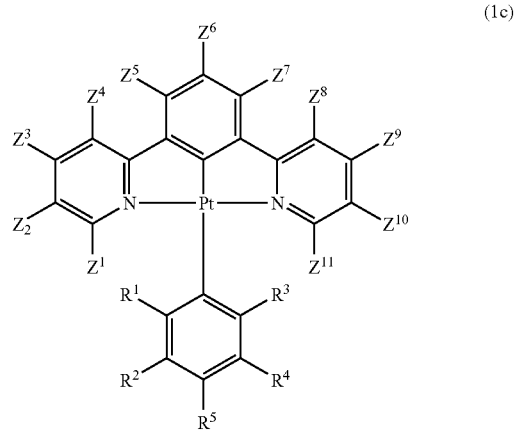

(1c)

wherein,
Z$^1$–Z$^{11}$ represent independently selected substituent groups, provided that adjacent substituent groups can combine to form rings, and provided that Z$^4$ and Z$^5$, and Z$^7$ and Z$^8$ can also combine to form rings; and
R$^1$–R$^5$ represent hydrogen or independently selected substituents, provided that adjacent substituent groups can combine to form rings.

15. The device of claim 14 wherein R$^1$ and R$^2$ of Formula (1c) combine to form a six-membered ring group.

16. The device of claim 14, wherein R$^1$ of Formula (1c) is a 1–12 carbon alkyl group.

17. The device of claim 14 wherein R$^1$ and R$^2$, of Formula (1c), combine to form a six-membered ring group.

18. The device of claim 14, wherein R$^3$ and R$^4$ also combine to form a six-membered ring group.

19. The device of claim 14, wherein $R^1$ and $R^3$ independently represent a 1–12 carbon alkyl group.

20. The device of claim 1 wherein the light-emitting material is disposed in a host material.

21. The device of claim 20 wherein the light emitting material is present in an amount of up to 50 wt % based on the host.

22. The device of claim 20 wherein the light emitting material is present in an amount of up to 15 wt % based on the host.

23. The device of claim 1 capable of emitting white light.

24. The device of claim 23 including a filtering means.

25. The device of claim 1 including a fluorescent light emitting material in addition to the organometallic complex light emitting material.

26. The device of claim 1 wherein the organometallic complex contains a quinolinyl or isoquinolinyl group.

27. A display comprising the OLED device of claim 1.

28. An area lighting device comprising the OLED device of claim 1.

* * * * *